United States Patent
Bharmal et al.

(10) Patent No.: US 10,896,111 B2
(45) Date of Patent: Jan. 19, 2021

(54) DATA HANDLING CIRCUITRY PERFORMING MEMORY DATA HANDLING FUNCTION AND TEST CIRCUITRY PERFORMING TEST OPERATION DURING EXECUTION OF MEMORY DATA PROCESSING

(71) Applicant: Arm Limited, Cambridge (GB)

(72) Inventors: Mohammadi Shabbirhussain Bharmal, Cambridge (GB); Kauser Yakub Johar, Cambridge (GB); Francisco João Feliciano Gaspar, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/670,063

(22) Filed: Oct. 31, 2019

(65) Prior Publication Data

US 2020/0201732 A1      Jun. 25, 2020

(30) Foreign Application Priority Data

Dec. 21, 2018   (GB) .................................. 1821044.3

(51) Int. Cl.
*G06F 11/30*         (2006.01)
*G11C 5/04*           (2006.01)
(Continued)

(52) U.S. Cl.
CPC ............ *G06F 11/3037* (2013.01); *G11C 5/04* (2013.01); *G11C 29/10* (2013.01); *G11C 29/12* (2013.01)

(58) Field of Classification Search
CPC ............ G11C 5/04; G11C 29/10; G11C 29/12
(Continued)

(56) References Cited

U.S. PATENT DOCUMENTS 5,036,516 A   7/1991   Cordell
8,359,501 B1   1/2013   Lee et al.
(Continued)

OTHER PUBLICATIONS

Combined Search and Examination Report for GB Application No. 1821044.3 dated Apr. 25, 2019, 7 pages.

*Primary Examiner* — Connie C Yoha
(74) *Attorney, Agent, or Firm* — Nixon & Vanderhye P.C.

(57) ABSTRACT

Circuitry comprises data handling circuitry having a memory, the data handling circuitry being operable in a primary mode in which the data handling circuitry performs a data handling function by accessing the memory and in a secondary mode in which the data handling circuitry performs the data handling function independently of the memory; test circuitry to control a test operation during execution of a set of data processing instructions by a data processor configured to execute data processing instructions by reference to the data handling function performed by the data handling circuitry; in which: the test circuitry is configured to control the data handling circuitry to transition from the primary mode to the secondary mode in response to initiation of a test operation on the memory so that the data processor executes one or more of the set of data processing instructions by reference to the data handling function performed by the data handling circuitry in the secondary mode at least while the test operation is performed on the memory; and the test circuitry is configured to control the data handling circuitry to return to the primary mode in response to completion of the test operation on the memory.

20 Claims, 7 Drawing Sheets

(51) Int. Cl.
*G11C 29/10* (2006.01)
*G11C 29/12* (2006.01)

(58) Field of Classification Search
USPC .............. 365/201, 189.01, 189.07, 194
See application file for complete search history.

(56) References Cited

U.S. PATENT DOCUMENTS

| 2012/0124436 | A1* | 5/2012 | Okahiro | G11C 29/34 |
| | | | | 714/726 |
| 2014/0053003 | A1 | 2/2014 | Moyer et al. | |
| 2015/0106673 | A1 | 4/2015 | Huang et al. | |
| 2018/0308560 | A1 | 10/2018 | LaVine et al. | |
| 2019/0198130 | A1* | 6/2019 | Chae | G11C 29/1201 |

\* cited by examiner

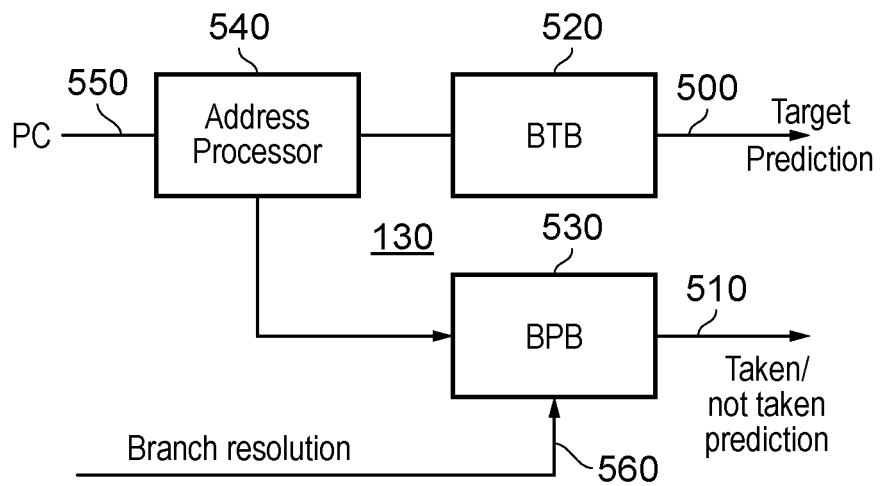
FIG. 6a
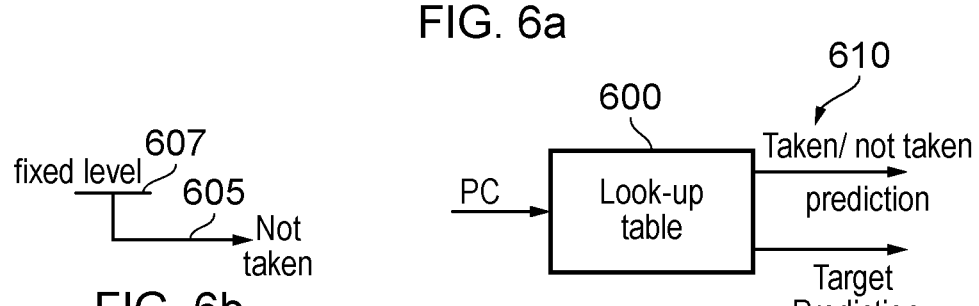
FIG. 6b
FIG. 6c
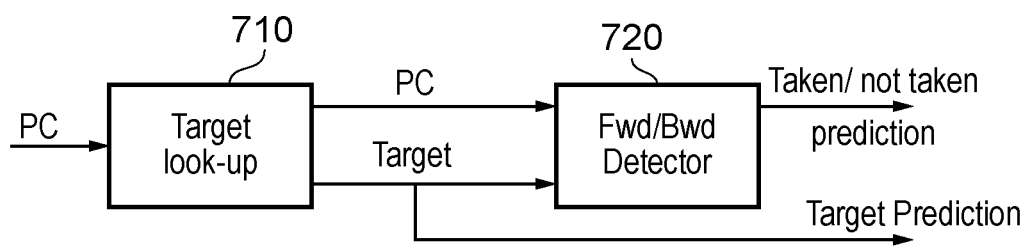
FIG. 6d
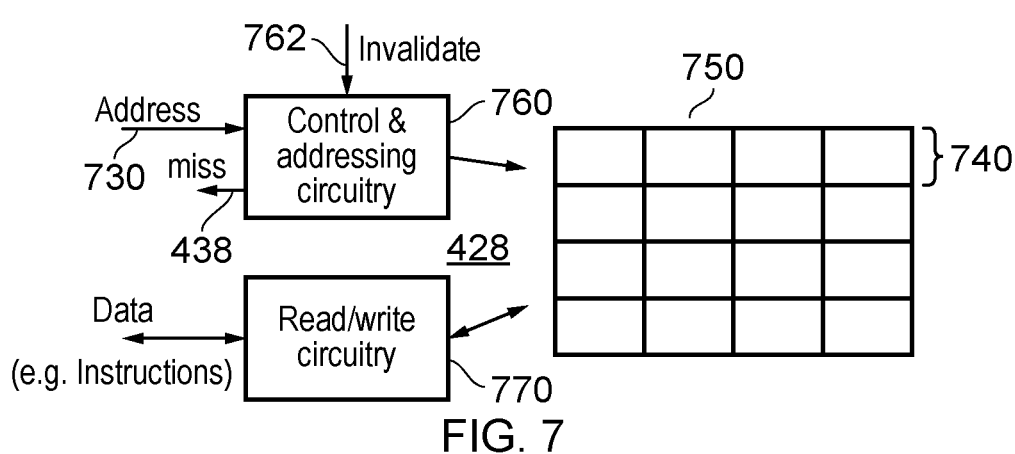
FIG. 7

DATA HANDLING CIRCUITRY PERFORMING MEMORY DATA HANDLING FUNCTION AND TEST CIRCUITRY PERFORMING TEST OPERATION DURING EXECUTION OF MEMORY DATA PROCESSING

This application claims priority to GB Patent Application No. 1821044.3 filed Dec. 21, 2018, the entire contents of which are hereby incorporated by reference.

BACKGROUND

This disclosure relates to circuitries and methods.

Some circuitry testing techniques can operate in an "online" mode, which is to say that the testing is performed while the circuitry under test is in use.

In the case of online testing some types of memory such as cache memories and branch predictor memories, data which would be stored in or accessed from the memory under test may need to be handled by another memory (such as a so-called tightly coupled memory) for the duration of the test. In some cases where the memory under test is being accessed by a processing element or the like, implementing the testing process can require at least a temporary change in the program code executed by the processing element.

SUMMARY

In an example arrangement there is provided circuitry comprising:

data handling circuitry having a memory, the data handling circuitry being operable in a primary mode in which the data handling circuitry performs a data handling function by accessing the memory and in a secondary mode in which the data handling circuitry performs the data handling function independently of the memory;

test circuitry to control a test operation during execution of a set of data processing instructions by a data processor configured to execute data processing instructions by reference to the data handling function performed by the data handling circuitry;

in which:

the test circuitry is configured to control the data handling circuitry to transition from the primary mode to the secondary mode in response to initiation of a test operation on the memory so that the data processor executes one or more of the set of data processing instructions by reference to the data handling function performed by the data handling circuitry in the secondary mode at least while the test operation is performed on the memory; and the test circuitry is configured to control the data handling circuitry to return to the primary mode in response to completion of the test operation on the memory.

In another example arrangement there is provided a method comprising:

executing data processing instructions by reference to a data handling function performed by associated data handling circuitry having a memory, the data handling circuitry being operable in a primary mode in which the data handling circuitry performs the data handling function by accessing the memory and in a secondary mode in which the data handling circuitry performs the data handling function independently of the memory;

controlling a test operation during execution of a set of data processing instructions by the data processor;

the controlling step comprising controlling the data handling circuitry to transition from the primary mode to the secondary mode in response to initiation of a test operation on the memory so that the executing step executes one or more of the set of data processing instructions by reference to the data handling function performed by the data handling circuitry in the secondary mode at least while the test operation is performed on the memory; and controlling the data handling circuitry to return to the primary mode in response to completion of the test operation on the memory.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which:

FIG. 6*a* schematically illustrates a primary branch predictor;

FIGS. 6*b*-6*d* schematically illustrate techniques for secondary branch prediction;

FIG. 7 schematically illustrates cache memory circuitry;

DESCRIPTION OF EMBODIMENTS

Figure 1:
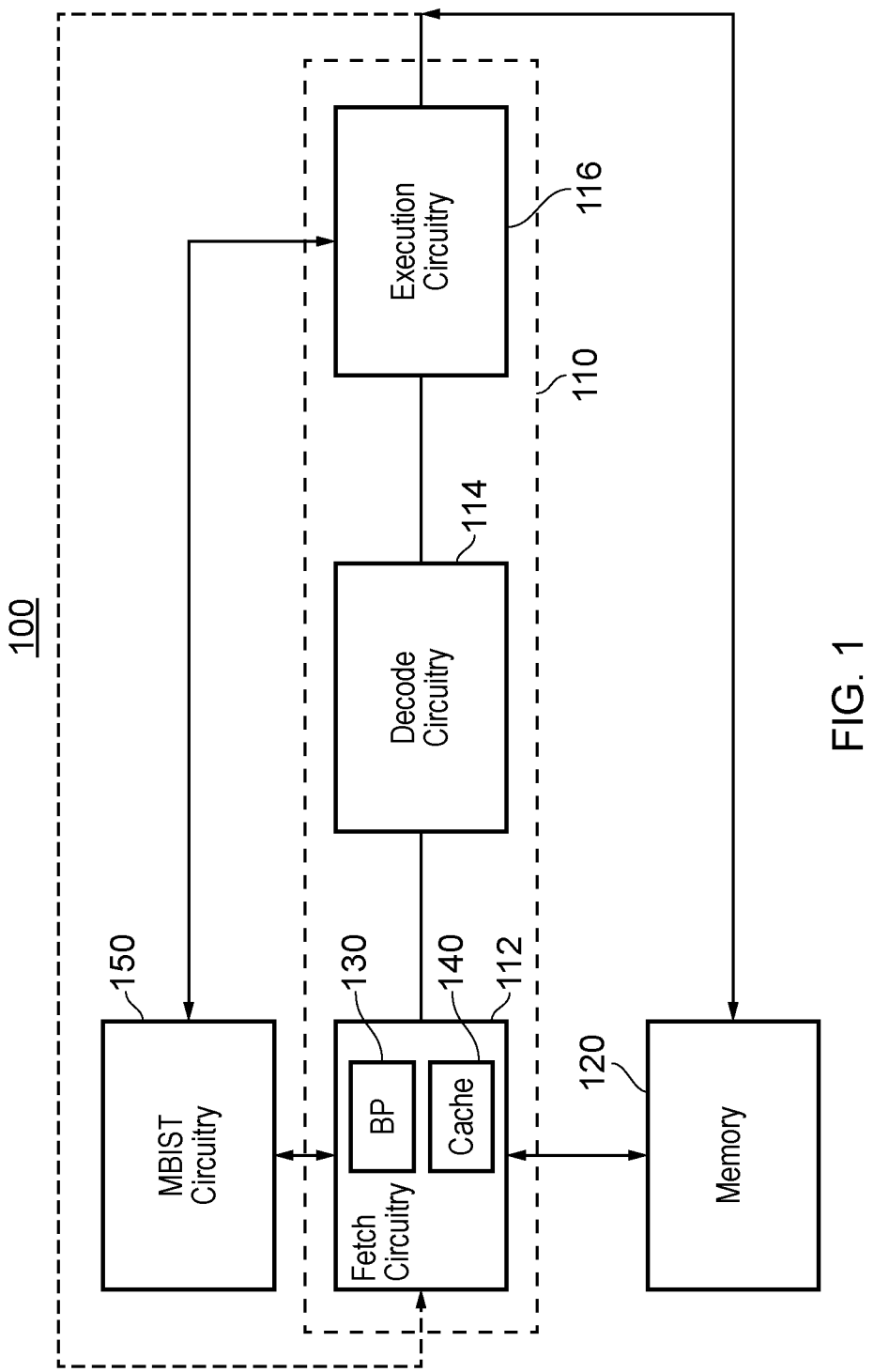
FIG. 1 is a schematic diagram of circuitry including a data processor.

Referring now to FIG. 1, circuitry 100 comprises a data processor 110 which executes data processing instructions. The data processor 110 comprises fetch circuitry 112 arranged to fetch instructions (for example, stored in a main memory 120) for execution, decode circuitry 114 to decode the fetched instructions and execution circuitry 116 to execute the decoded instructions.

In its overall functionality, the data processor 110 executes the data processing instructions by reference to a data-handling function performed by associated data-handling circuitry having a memory. In fact, two examples of such data-handling circuitry are shown in FIG. 1. These examples are branch prediction circuitry having a memory and cache memory circuitry having a cache memory. Either or both of these examples (or indeed another example) may be used in an actual implementation.

Therefore, in FIG. 1, the example data-handling circuitries are a branch predictor (BP) 130 and cache control circuitry 140. Each of these will be discussed in further detail below and, as mentioned above, may be implemented separately or together.

FIG. 1 also shows a so-called MBIST circuitry 150. The abbreviation "MBIST" stands for "memory built-in self-test". In the context of the circuitry 100 being implemented as, for example, one or more integrated circuit devices, the MBIST circuitry 150 is fabricated as part of the one or more integrated circuits and so, in this manner, it is "built-in". But also, in the present example, the MBIST circuitry 150 is operated according to a so-called "online" MBIST technique, which actually means that the self-testing function is performed during otherwise normal operation of the remainder of the circuitry 100, which is to say that a test operation is performed during execution of a set of data processing instructions by the data processor. Techniques by which this is handled will be discussed below.

The actual testing process performed by the MBIST circuitry 150 relates to the performance of memory circuitry forming part of or otherwise associated with the data-handling circuitry (130, 140 in this example). In various situations, but particularly so-called functional safety applications (such as circuitry used in devices for automotive or avionic applications) it is considered important to check the performance of memory circuitry on an ongoing basis, for example to detect so-called "stuck-at faults", which represent memory faults in which a particular data bit of the memory storage erroneously remains at either a 1 or a 0. Examples of the type of testing carried out by MBIST circuitry will be discussed below with reference to FIGS. 2 and 3.

In the examples to be discussed below, test circuitry (comprising at least an MBIST or similar circuitry under the control of at least one processor) is arranged to control a test operation during execution of a set of data processing instructions by a data processor configured to execute data processing instructions by reference to the data handling function performed by data handling circuitry. The data handling circuitry has a memory and is operable in a primary mode in which the data handling circuitry performs a data handling function by accessing the memory and in a secondary mode in which the data handling circuitry performs the data handling function independently of the memory. The test circuitry is configured to control the data handling circuitry to transition from the primary mode to the secondary mode in response to initiation of a test operation on the memory so that the data processor executes one or more of the set of data processing instructions by reference to the data handling function performed by the data handling circuitry in the secondary mode at least while the test operation is performed on the memory; and the test circuitry is configured to control the data handling circuitry to return to the primary mode in response to completion of the test operation on the memory.

Generic MBIST Example

Figure 2:
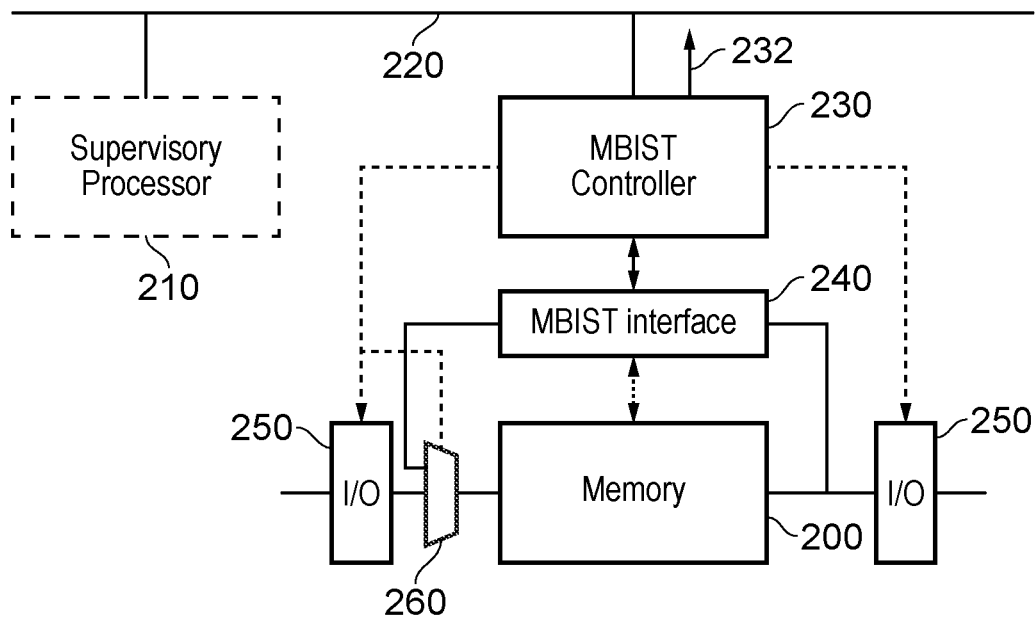
FIG. 2 schematically represents an online testing arrangement.

FIG. 2 schematically illustrates an MBIST arrangement applicable to an example memory 200, which may be an arbitrary individual memory within an overall larger system (not shown for the purposes of the explanation of FIG. 2).

In FIG. 2, the testing operations are overseen by a supervisory processor 210 executing data processing instructions relating to testing and potentially other functions. This is drawn in broken line to signify that it may be a separate processor or it may represent testing or other functions carried out by, for example, execution circuitry used for another purpose such as the execution circuitry 116 of FIG. 1.

The supervisory processor 210 is linked by a bus arrangement 220, which may be a dedicated test bus or may be shared with other functions, to an MBIST controller 230 which, under the overall control of the supervisory processor 210, handles the testing of the memory 200.

In some examples, the MBIST controller 230 has an associated MBIST interface 240 directly into the memory 200 which allows it to access individual memory cells or groups of cells for testing purposes. In some examples, the MBIST controller 230 also provides control signals to input/output circuitry 250 which allows the memory 200 to be selectively isolated from the rest of the system at least for the duration of the testing performed by the MBIST controller 230.

In other examples, however, the MBIST controller can make use of the functional interface of the memory 200, or in other words the interface by which operational data is written to or read from the memory 200 during routine operation of the memory. In such arrangements the MBIST controller 230 controls a schematic multiplexer 260 at an input (data write) port of the memory 200 so as to write either functional data (normal data in the normal course of data processing) or test data provided by the MBIST interface 240. The MBIST controller is also connected to receive data from the output side or port of the memory 200 as drawn, so that it can selectively read the test data from the memory 200.

In general, an example arrangement would be expected to use either the direct connection from the MBIST interface 240 or the connection from the MBIST interface shared with the functional data, but not both. The present examples below make use of the second example, namely the connection shared with the functional data. However, the present techniques could be used with an arrangement by which test data is written to and read from the memory by a dedicated MBIST interface. Therefore, the arrangements of FIG. 4 below show an input multiplexer as discussed above for the memory under test, and a connection between the memory output and an MBIST interface.

Figure 3:
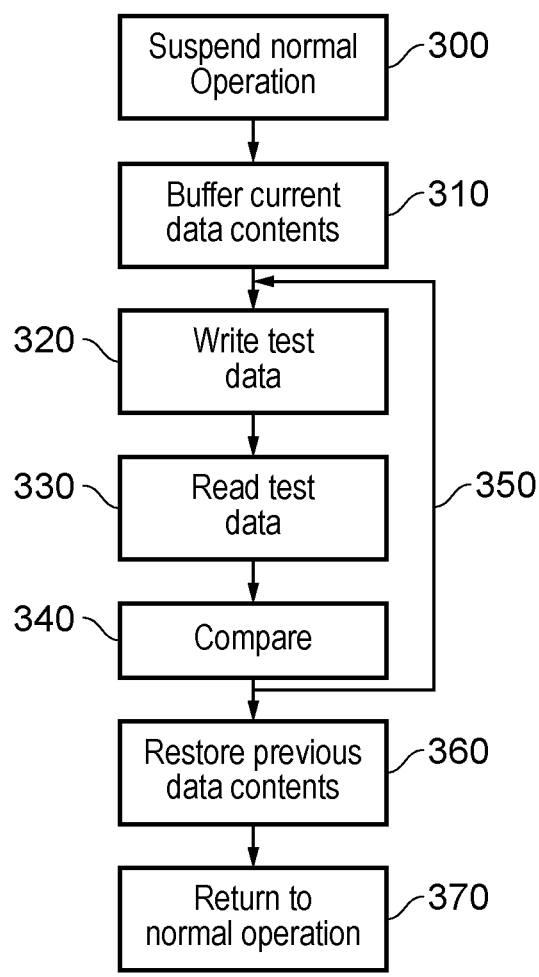
FIG. 3 is a schematic flowchart illustrating a method.

FIG. 3 is a schematic flowchart illustrating a testing method performed by the example MBIST controller 230 of FIG. 2.

At a step 300, the MBIST controller 230 suspends normal operation of the memory 200, for example by controlling the input/output circuitry 250 to isolate the memory 200 from the rest of the system.

At a step 310, the MBIST controller 230 buffers (or controls the buffering of) the current data contents of whichever portion of the memory 200 is to be tested. For example, a particular test operation can relate to a sub-portion of the memory, with the sub-portion changing from test operation to test operation so that the whole memory is tested over the course of a set of two or more test operations.

A testing cycle then comprises writing test data to the memory portion under test at a step 320, reading the test data back again at a step 330 and comparing (at a step 340) the test data as written with the test data as read. The testing cycle may be repeated 350 one or more further times, for example operating on the same or a different portion of the memory 200. At any instance of the testing cycle, if the comparison at the step 340 reveals that the test data as read back is different to the test data as previously written then a fault is detected. Suitable actions upon detecting a fault can include one or more of: (i) sending a fault indication back to the supervisory processor 210; and (ii) issuing an interrupt 232 in order to provoke a remedial or diagnostic action by the supervisory processor 210 or another processor in the system.

Returning to FIG. 3, after all of the instances of the testing cycle have been performed, and assuming that a fault was not detected, control passes to a step 360 at which the previously buffered data contents are restored to the portion of the memory 200 under test, overwriting the last-written test data. Finally, at a step 370 normal operation of the memory 200 can be resumed, for example by the MBIST controller 230 controlling the input/output circuitry 250 to allow normal data communication with the memory 200.

In order for such a testing technique to be performed in an "online" manner, which is to say while the overall system continues operating, either the overall system needs to adapt to operating without the facility normally provided by the memory 200 or data which would normally be handled by the memory 200 needs to be handled by an alternative memory or storage device. In at least some previously-proposed examples, in order to achieve online MBIST testing of memory devices such as cache memories, it has been necessary to modify the executing code (such as so-called "mission software" indicating that this is the code relating to a main purpose of the overall system) so that during the MBIST testing another memory such as a so-called tightly coupled memory (TCM, not shown in FIG. 2) is used in place of the cache memory.

It is, however, considered desirable to be able to provide online MBIST testing of functional memories associated with data-handling circuitry, in a situation in which a data processor such as the data processor 110 executes data processing instructions by reference to a data-handling function provided by the associated data-handling circuitry, without the need necessarily to modify the executable or mission code for the period of the testing itself.

Figure 4:
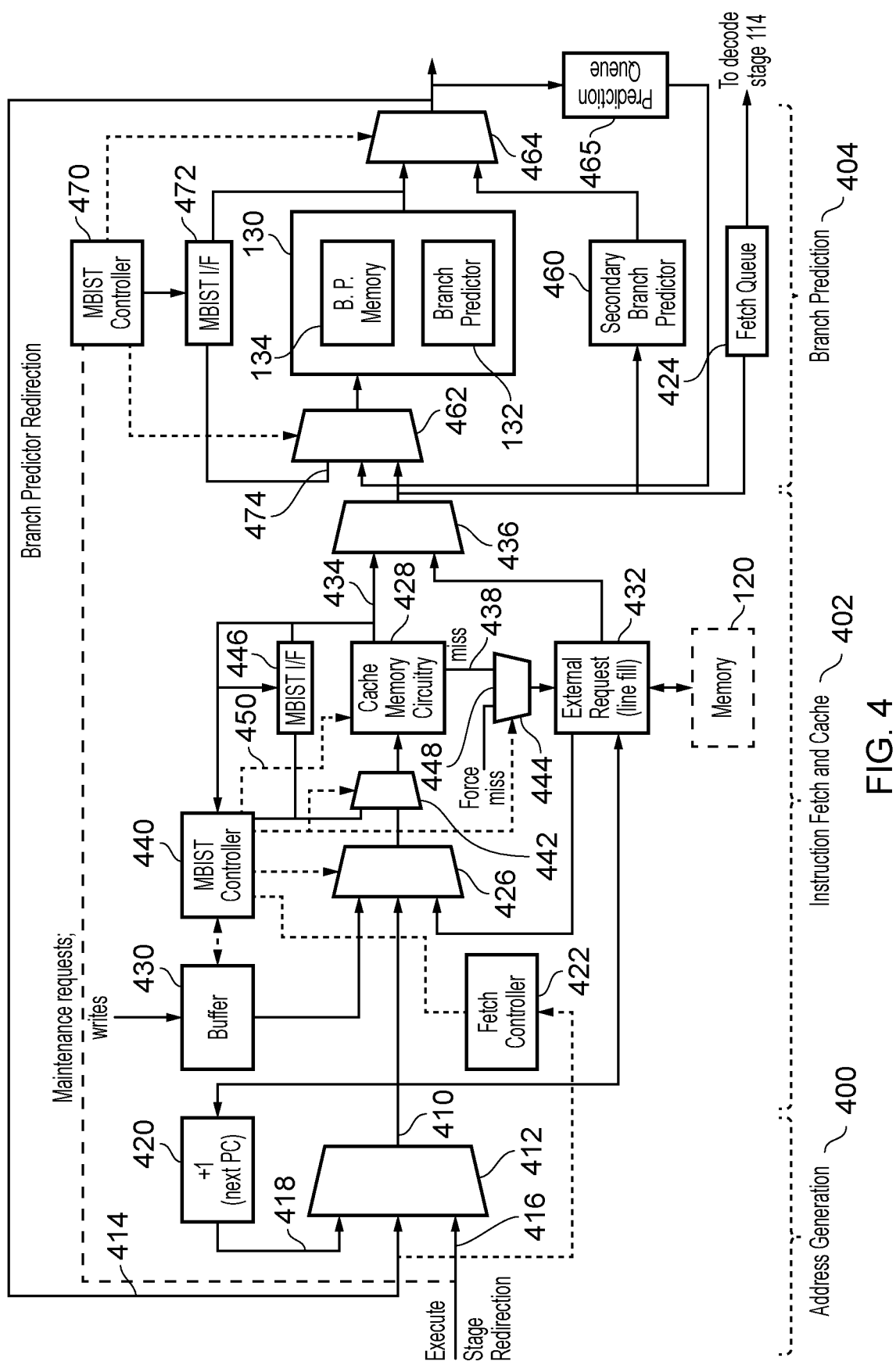
FIG. 4 schematically illustrates circuitry including fetch circuitry and testing circuitry.

FIG. 4 schematically illustrates at least a part of a data processor which can alleviate this potential problem.

The arrangement of FIG. 4 makes use of MBIST techniques such as those discussed above with reference to FIG. 2, such that an MBIST interface shares the functional interface of the memory under test. However, other embodiments could use a direct dedicated interface from the MBIST interface.

In a comparison with the schematic overview of FIG. 1, FIG. 4 shows aspects of the fetch circuitry 112, the MBIST circuitry 150 and (in broken line to illustrate that it may be separately implemented or may be connected to the remainder of the circuitry of FIG. 4 by intervening interconnect or similar circuitry) the memory 120.

FIG. 4 shows aspects of the fetch circuitry 112 corresponding to the functions of address generation 400, instruction fetch and caching 402 and branch prediction 404. Note that FIG. 4 does not show the decode circuitry 114 or the execution circuitry 116 but the connection of these via a fetch queue 424 is discussed further below.

The address generation stage 400 generates an address 410 of an instruction to be fetched by selecting (using a schematic multiplexer 412) between a program counter value 414 provided by a branch predictor redirection (to be discussed further below); a program counter value 416 provided by the execution circuitry 116 as an execute stage redirection; and a program counter value 418 generated by a schematic adder 420 as a next program counter value following the previously output value 410.

A fetch controller 422 oversees the fetch process. A schematic multiplexer 426 selects inputs to be provided to cache memory circuitry 428 between the following: (i) cache maintenance requests or invalidation requests provided via a buffer 430; (ii) read address information from the multiplexer 410; and line fill information (for example so-called cache lines) read from the memory 120 by circuitry 432 to control the reading of currently not-cached information from the memory 120.

This provides an example of the circuitry comprising fetch circuitry (including the controller 422) to fetch data processing instructions for execution, the fetch circuitry and the branch predictor cooperating to maintain a fetch queue 424 of instructions to be fetched.

In response to a request to read a next instruction from the cache memory circuitry 428, there will be either a cache hit or a cache miss depending on whether the required next instruction is already held by the cache memory circuitry 428. In the event of a cache hit or data arrival from external memory, the required instruction (and/or in some examples, the instruction address and some decoded information about the instruction) is output 434 and provided via a schematic multiplexer 436 to the branch prediction stage 404.

In the event of a cache miss, signalled by a miss signal 438, the circuitry 432 is prompted to retrieve the required instruction (or in fact, at least one cache line including the required instruction) from the memory 120 and to provide it both to the schematic multiplexer 436 for routing to the branch prediction stage 404 and also to the schematic multiplexer 426 for writing to the cache memory assuming that the particular cache line is flagged as "cachable". (If a cache line is flagged as "non-cachable" it is routed by the circuitry 432 directly to the schematic multiplexer 436).

Instruction flow to the decode circuitry 114 of FIG. 1 is by way of a fetch queue 424 which passes instructions at the output of the multiplexer 436.

At the branch prediction stage 404, the branch prediction circuitry 130, comprising a branch predictor 132 interacting with a branch predictor memory 134, makes a prediction of the outcome of any branch or similar instructions leading to a non-successive change in program counter value in the instruction stream. The prediction generated by the branch prediction circuitry 130 may include a prediction of a branch target, which is to say a next program counter value, and a prediction of whether the current branch will be taken or not. In the case that the prediction by the branch prediction circuitry 130 relates to a non-linear or non-successive change in program counter value, the predicted next instruction address 414 is provided to the address generation stage 400 as the signal 414 mentioned above.

A prediction queue 465 may hold a queue of data defining predicted next data processing instructions.

In instances where the branch prediction is wrong, an execute stage redirection 416 is provided to the address generation stage 400. Because of the pipelined nature of many data processors such as the data processor 100, by the time a redirection at the execution stage is issued, the fetching and decoding process of a number of other instructions may already be under way. Therefore, in response to a redirection 416 of this type, the fetch controller 422 controls the flushing or invalidation of the current contents of the fetch queue 424. Also, though not shown in FIG. 4, a redirection of this type can lead to a flushing of the decode and execution pipelines so that they can be reloaded with instructions starting from the newly redirected program counter value. The prediction queue 465 is also flushed.

The use of the fetch queue 424 and the prediction queue 465 provide an example in which the fetch circuitry and the branch predictor cooperate to maintain one or more queues of data defining one or more predicted instructions.

This arrangement therefore provides an example in which the fetch circuitry is configured to discard a currently fetched instruction and to flush the one or more queues in response to a flushing event such as execution of a given branch instruction by the data processor generating a branch in program flow different to a branch flow predicted by the branch predictor, a processor interrupt and/or a processor context switch.

Note that the prediction queue 465 can simply define or identify the predicted instructions. In other examples, the branch predictor may be configured to associate information with instructions in the one or more queues indicative of whether a prediction of those instructions was made by the branch predictor operating in the primary mode or in the secondary mode. For example, the prediction queue could store an indication associated with each queued predicted instruction of whether the instruction was predicted by the (primary) branch predictor 132 or by the secondary branch predictor 460. In the case of instructions predicted by the (primary) branch predictor 132, the execution of those instructions can be used to update the BTB and/or BPB of the primary branch predictor 132 (being temporarily buffered if necessary if the update is generated while the branch predictor memory 134 is unavailable because of testing taking place). In the case of instructions predicted by the secondary branch predictor 460, either no update is required or (in the case of a register bank implementation) the register bank can be updated in response to execution of those instructions. This arrangement allows a transition between primary and secondary modes to be made at substantially any time, without adversely affecting the update of the branch predictor memory 134. Other options, involving measures relating to the timing of such a transition, are discussed below.

In the example of FIG. 4, the cache memory circuitry 428 and the branch predictor memory 134 are each subject to online MBIST testing. However, techniques are provided to allow for normal operation of the data processor 110 to continue during the testing, which is to say that data processing instructions can continue to be executed by the data processor 110 without the need to modify such instructions in the manner described above (for example, so that a TCM is used instead of a cache memory). As mentioned, the testing of the cache memory circuitry 428 and the testing of the branch predictor memory 134 can be provided individually and independently or can both be implemented as shown in FIG. 4.

In general terms, the data handling circuitry (such as the branch prediction circuitry and/or the cache memory circuitry) is operable in a primary mode in which the data handling circuitry performs the data handling function by accessing the memory and in a secondary mode in which the data handling circuitry performs the data handling function independently of the memory. An MBIST controller acts as a test controller to control an online MBIST test operation during execution of a set of data processing instructions by the data processor. The test circuitry (discussed below) is configured to control the data handling circuitry to transition from the primary mode to the secondary mode in response to initiation of a test operation on the memory so that the data processor executes one or more of the set of data processing instructions by reference to the data handling function performed by the data handling circuitry in the secondary mode at least while the test operation is performed on the memory and is configured to control the data handling circuitry to return to the primary mode in response to completion of the test operation on the memory.

The primary mode and secondary mode can be distinguished by (for example) using at least parts of the same circuitry in different manners (as in the example to be discussed below in connection with the cache memory circuitry 428), and/or by using alternate circuitry to achieve a similar overall function (as in the example to be discussed below of the primary 130 and secondary 460 branch predictors). In this latter example, there is no requirement that the secondary circuitry does not itself have a memory; just that any memory of the secondary circuitry is not itself subject to the online testing when the primary circuitry is taken out of use for online testing. Having said this, given that the duty cycle of online testing is generally small, it can be advantageous to employ a simple (and small area in terms of integrated circuit fabrication) secondary circuitry so as to alleviate any cost penalty in providing the secondary circuitry.

Example—MBIST Testing of the Cache Memory Circuitry 428

In this example the associated data handling circuitry comprises cache memory circuitry; the memory is a cache memory; and the data handling function comprises providing one or more data items to the data processor.

An MBIST controller 440 with ancillary circuitry to be discussed below executes a test operation with respect to the cache memory circuitry 428, under the control of the execution circuitry 116 and/or the supervisory processor 210. The MBIST controller 440 interacts with: the fetch controller 422, the schematic multiplexer 426, further schematic multiplexers 442, 444 and, via an MBIST interface 446, the cache memory circuitry 428 itself.

Referring to the stages in an online MBIST testing process discussed with reference to FIG. 3, corresponding to the step 300 the MBIST controller 440 suspends operation of the cache memory circuitry 428 by the following techniques: (i) access requests are no longer routed to the cache memory circuitry 428, by controlling the schematic multiplexer 442 to isolate the cache memory circuitry 428 from the output of the schematic multiplexer 426; (ii) the schematic multiplexer 444 is controlled to provide a forced miss output 448 to the circuitry 432, causing the circuitry 432 to obtain any newly required data items such as a next instruction from the memory 120; (iii) any cache maintenance requests or write requests are buffered by the buffer 430 to be applied to the cache memory circuitry 428 after the testing process has completed. These techniques are such that the cache memory circuitry 428 continues to operate but in a secondary mode in which the cache memory circuitry performs its data handling function (the provision of instructions (in this example) or other data to the data processor for use in the execution of data processing instructions) independently of the cache memory; and (iv) the setting of the "cachable" flag associated with any external requests during the period of secondary mode operation to "non-cachable". Note that this flag is normally set by a memory management unit (MMU) (not shown) so this action by the MBIST controller 440 can involve temporarily requesting the MMU to change a parameter associated with a memory location or region of the requested data item, subject to having the privilege to do so, or locally and temporarily overwriting the cachable flag for the purposes of an individual external access. With regard to item (iv), this provides an example involving fetch circuitry (422, 432) to fetch data processing instructions for execution, the fetch circuitry being configured, for a given data processing instruction having an associated parameter indicating that the given data processing instruction is cachable, to store the given data processing instruction in the instruction cache and, for a given data processing instruction having an associated parameter indicating that the given data processing instruction is non-cachable, to provide the given data processing instruction directly to the data processor for execution, in which the test circuitry is configured to set the associated parameter to non-cachable for the one or more data processing instructions fetched during operation of the data handling circuitry in the secondary mode. When a line is marked as non-cacheable the required data must be read from the line-fill circuitry 432 rather than from the cache memory circuitry 428, under the control of the schematic multiplexer 436.

The use of the schematic multiplexer 436 to isolate the cache memory circuitry 428 from access requests provides an example in which the test circuitry is configured to control the data processor not to retrieve data processing instructions from the cache memory during operation of the data handling circuitry in the secondary mode. In other examples, the MBIST controller 440 could simply instruct other circuitry such as the schematic multiplexer 426 not to issue access requests to the cache memory circuitry 428.

The use of the schematic multiplexer 444 to select the forced miss signal 448 provides an example of the test circuitry being configured to control the cache memory circuitry to indicate a cache miss to the data processor in response to a cache retrieval operation initiated by the data processor during operation of the data handling circuitry in the secondary mode. This in turn provides an example of the test controller being configured to control the data processor not to retrieve data processing instructions from the cache memory during operation of the data handling circuitry in the secondary mode.

Note therefore that the suspension of normal operation at the step 300, when applied in this way to the cache memory circuitry 428, is not apparent to the program code executing at the data processor 110. Data processing instructions can continue to be executed without themselves needing to be changed; the only effect from the point of view of the execution of the program code may be a marginal and temporary lowering of performance because the normal benefits of using caching, in terms of potentially more rapid access to required information such as next program instructions, are not obtained during the testing process.

The MBIST controller 440 then performs the steps 310 ... 350 in that, via the MBIST interface 446, the current contents of whichever portion of the cache memory circuitry 428 is being tested are buffered (for example by a buffer forming part of the MBIST controller 440) and the writing, reading and comparison of test data is performed one or more times with respect to the portion of the test. Then, the step 360 involves restoring the buffered contents and the cache memory circuitry 428 can be returned to normal use (the primary mode of operation) at the step 370.

In the example of the cache memory circuitry 428, the step 370 can involve the MBIST controller 440 controlling:

(i) the schematic multiplexer 444 to allow the "miss" signal 438 (rather than the forced miss signal) to pass to the circuitry 432.

(ii) the schematic multiplexer 442 to allow the output of the schematic multiplexer 426 to be passed to the cache memory circuitry 428.

(iii) the buffer 430 and the schematic multiplexer 426 to implement, in the order received, any and all maintenance requests and write requests buffered by the buffer 430, before any other accesses to the cache memory circuitry 428 are allowed by the schematic multiplexer 426

This use of the buffer 430 in item (iv) provides an example in which the test circuitry comprises or controls a buffer to buffer operations to modify the contents of the cache memory initiated during operation of the data handling circuitry in the secondary mode, the test circuitry being configured to implement the buffered operations to modify the contents of the cache memory in response to the data handling circuitry returning to the primary mode. For example, such operations to modify the contents of the cache memory comprise operations selected from the list consisting of: (a) operations to invalidate a data item held by the cache memory; and (b) operations to write a data value to the cache memory.

Using these techniques involving the buffer 430, the state of the cache memory circuitry 428 is returned to the state it would have had if it had been in normal operation throughout the period of the testing process.

With regard to maintenance requests and write requests, these can arise because of alterations to the corresponding addresses in main memory 120 or for other reasons. If, during the period of time occupied by the testing process, more such items are received than the buffer 430 is capable of holding, then the MBIST controller 440 can simply discard the buffered requests and instead issue an invalidation 450 at resumption of normal operation of the cache memory circuitry 428 in order to invalidate the entire contents of the cache memory circuitry 428.

This therefore provides an example in which: the buffer has a capacity to buffer up to a predetermined number of operations to modify the contents of the cache memory; and the test circuitry is configured, in response to more than the predetermined number of operations to modify the contents of the cache memory being initiated during operation of the data handling circuitry in the secondary mode, to control the invalidation of the cache memory in response to the data handling circuitry returning to the primary mode.

Example—MBIST Testing of the Branch Predictor Memory 134

In these examples, the associated data handling circuitry comprises a branch predictor; and the data handling function comprises the prediction of a next data processing instruction to be fetched for execution by the data processor.

Here, a similar arrangement is provided to that described above, with once again the aim being that program code execution can continue with the required alteration to the data processing instructions themselves and the only penalty introduced by the testing process being a potential marginal reduction in performance.

In addition to the (primary) branch prediction circuitry 130, a secondary branch predictor 460 is provided in FIG. 4. In the example shown, the output of the schematic multiplexer 436 is provided to the secondary branch predictor 460 as well as to the branch prediction circuitry (by a "normal operation" path through a schematic multiplexer 462). So, under normal operation, both the branch prediction circuitry 130 (a primary branch predictor) and the secondary branch predictor 460 generate respective predictions, but it is the output of the branch prediction circuitry 130 which is routed by a schematic multiplexer 464 as the branch prediction output forming the signal 414 in normal operation.

An MBIST controller 470 having an associated MBIST interface 472 controls the schematic multiplexers 462, 464. Note that the MBIST controller 470 and the MBIST controller 440 (if indeed both are provided) may be invented by common circuitry or by separate circuitries connected by the bus arrangement 220 of FIG. 2.

Referring again to the steps of FIG. 3, at the step 300, the MBIST controller 470 suspends normal operation of the primary branch prediction circuitry 130 by controlling the schematic multiplexer 462 to select an input 474 from the MBIST interface 472 and controlling the schematic multiplexer 464 to output the predictions generated by the secondary branch predictor 460 rather than those generated by the branch prediction circuitry 130.

This has the effect of the test circuitry controlling the branch prediction circuitry to transition from the primary mode (in which the primary branch prediction circuitry 130 is enabled and used) to the secondary mode (in which the secondary branch predictor 460 is used) in response to initiation of a test operation on the memory so that the data processor executes one or more of the set of data processing instructions by reference to the data handling function performed by the data handling circuitry in the secondary mode at least while the test operation is performed on the memory; the test circuitry being configured to control the data handling circuitry to return to the primary mode in response to completion of the test operation on the memory Then, using the MBIST interface 472, the MBIST controller 470 implements the steps 310 . . . 360 with reference to the branch predictor memory 134. Finally, the MBIST controller 470 implements the step 370 and a return to normal operation by controlling the schematic multiplexers 462, 464 to route information to the primary branch prediction circuitry 130 and to route predictions generated by the branch prediction circuitry 130 as the output forming the signal 414. This represents a transition back from the use of the secondary branch predictor 460 to the use of the primary branch prediction circuitry 130 in response to completion of the test operation on the memory.

Branch prediction operations and at least some differences or potential differences between the branch prediction circuitry 130 and the secondary branch predictor 460 will now be described.

Summary of Examples

Figure 5A:
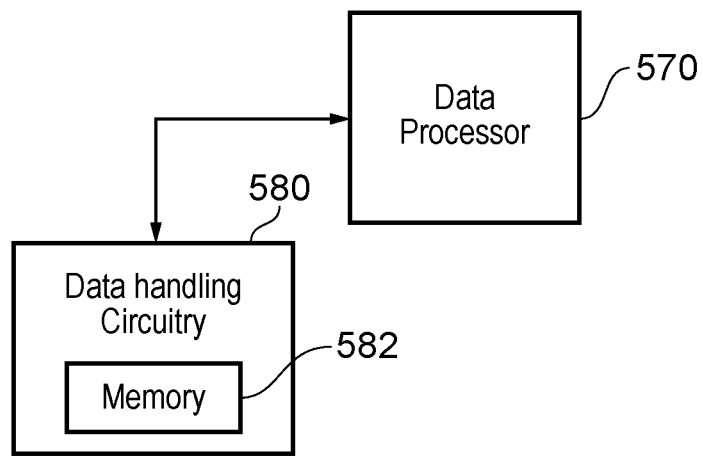
FIGS. 5*a*-5*c* schematically illustrate examples of circuitry.
Figure 5B:
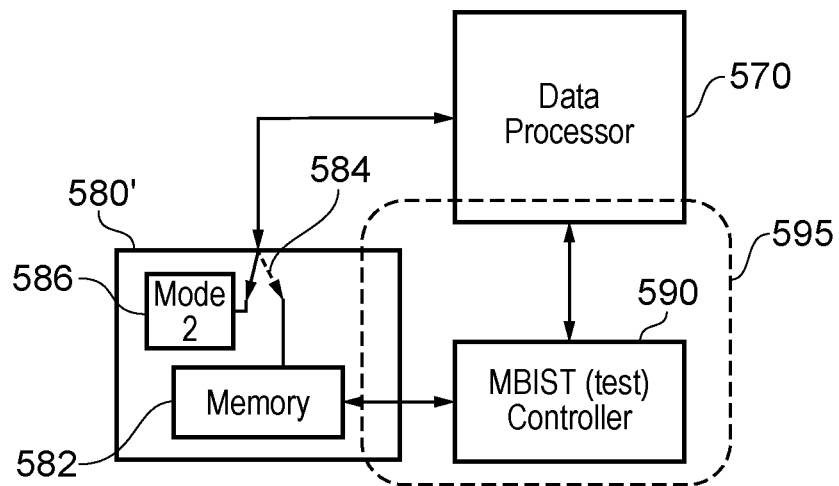
Figure 5C:
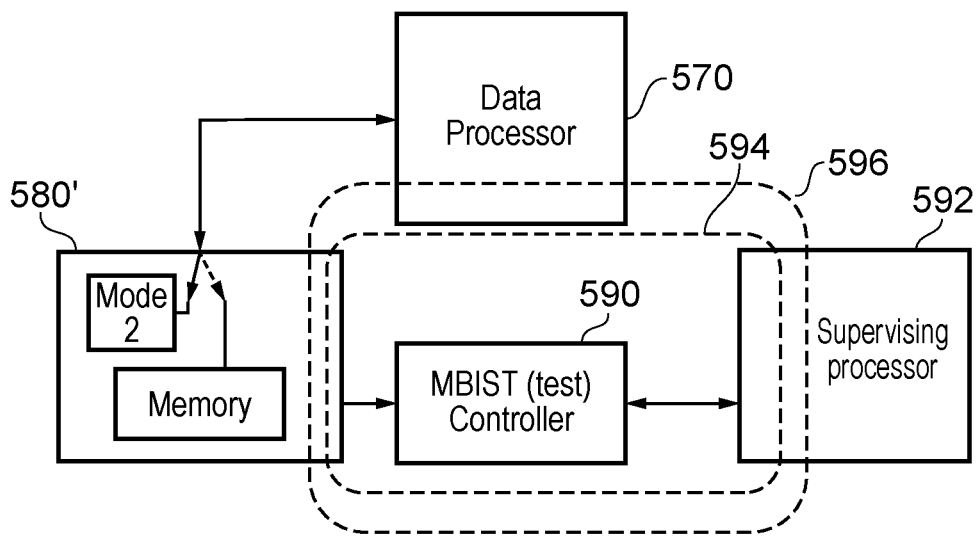

FIGS. 5*a*-5*c* schematically provide examples of respective circuitries.

In FIG. 5*a*, a data processor 570 is configured to execute data processing instructions by reference to a data handling function performed by data handling circuitry 580. The data handling circuitry makes use of a memory 582. Referring to the specific example of FIG. 4, the data handling circuitry 580 and the memory 582 might be implemented as one or both of:

(a) the branch predictor 130 and the branch predictor memory 134, in which case the data handling function is the prediction of a next data processing instruction to be fetched for execution by the data processor 570; and/or (b) the cache memory circuitry 428 and associated circuitry to fetch and handle information to be cached, in which case the data handling function comprises providing one or more data items to the data processor 570.

In other examples the memory 582 might be implemented as a write through data cache, with similar testing taking place while maintaining data coherency.

FIG. 5*b* introduces further features relevant to the discussion of FIG. 4, in particular that the data handling circuitry 580' is operable in a primary mode in which the data-handling circuitry 580' performs the data-handling function by reference to (accessing) the memory 582, and in a secondary mode in which the data-handling circuitry performs the data-handling function independently of the memory 582. The selection of the primary mode and the secondary mode is shown schematically in FIG. 5*b* by a schematic switch 584, and circuitry to provide operation in the secondary mode is shown schematically as "mode 2" circuitry 586 (an example being the secondary branch predictor 460, or in the case of the cache memory example, the secondary mode is handled by much of the same circuitry but operating in a different manner to its operation in the primary mode).

A test controller 590 such as an MBIST controller (corresponding to the controller 440 or the controller 470 in FIG. 4) is provided to control online testing of the memory 582 using techniques discussed above.

In this context (FIG. 5*b*) a feature refers to as "test circuitry" 595 may be considered to encompass the test controller 590, operating under the control of the data processor 570 (shown schematically as comprising a part of the functionality of the data processor 570) and including part of the functionality of the data-handling circuitry 580 (encompassing the use or interconnection of the interfaces 446, 472).

Therefore, in this example, the circuitry comprises the data processor 570 and the test circuitry comprises a test controller 590 operating under the control of the data processor. Note that this does not exclude the possibility of the test circuitry comprising at least part of the functionality of the data handling circuitry 580'.

A similar arrangement is shown in FIG. 5C, except that a supervisory processor 592 is also provided to provide at least some of the control of the test controller 592. Note that a supervisory processor is not illustrated explicitly on FIG. 4 but may be provided to fulfil this functionality. In this context, if the data processor 570 does not itself contributes to the control of the test controller 590, then the "test circuitry" 594 may be taken to comprise the test controller 590, at least a part of the functionality of the supervisory processor 592 and at least part of the functionality of the data-handling circuitry 580'. If the data processor 570 also contributes to the control of the test operations, then the "test circuitry" 596 may be taken to comprise the test controller 590, at least a part of the functionality of the supervisory processor 592, at least part of the functionality of the data processor 570 and at least part of the functionality of the data-handling circuitry 580'.

Therefore, in this example, the circuitry comprises a supervisory processor 592 separate to the data processor and the test circuitry comprises a test controller 590 operating under the control of at least the supervisory processor. Note that this does not exclude the possibility of the test controller 590 being controlled, at least in part, by the data processor 570 as well, nor does it exclude the possibility of the test circuitry comprising at least part of the functionality of the data handling circuitry 580'.

Example of Primary Branch Predictor

FIG. 6*a* schematically represents an example of the branch prediction circuitry 130 which generates a prediction 500 of a branch target and a prediction 510 of whether a branch is taken or not taken. These are based upon data stored in one or more memories, which may relate to the historical outcome of at least some previous instructions such as branches which were taken. For example such data may be stored in a branch target buffer (BTB) 520 and a branch prediction buffer (BPB) 530 both of which individually and collectively represent examples of at least parts of the branch predictor memory 134. Therefore, in these examples, the memory is configured to store history information dependent upon an execution outcome of at least a subset of branch data processing instructions previously executed by the data processor; and in the primary mode, the branch predictor is configured to predict a next data processing instruction to be fetched for execution in dependence upon the stored history information.

The choice of which data items to access within the branch target buffer 520 and the branch prediction buffer 530 is made according to execution of an algorithm such as a hashing algorithm by address processor 540 with respect to the program counter (PC) value 550 of the current data processing instruction.

At least the branch prediction buffer 530 can be updated by information 560 representing the subsequent resolution of a branch instruction by the execution circuitry 116.

Examples of Secondary Branch Predictors

Various examples of the secondary branch predictor 460 are possible. These have in common that a memory such as the branch predictor memory 134 is not used, or at least is not subjected to online testing at the same time as the branch predictor memory 134. In some examples, a register bank of one or more registers may be provided in order to implement in the secondary mode (at least to a limited extent) the adaptive functionality provided by the BTB and/or BPB in the primary mode. The use of a register bank can provide an example in which in the secondary mode, the branch predictor is configured to generate a prediction of a next data processing instruction to be fetched for execution in response to input data stored in one or more registers indicative of the execution outcome of at least a subset of branch data processing instructions previously executed by the data processor.

Since, in normal circumstances, the testing process would be expected to have a relatively small duty cycle, which is to say that the circuitry of FIG. 4 spends almost all of its time in "normal" operation, in order not to waste resources and integrated circuit substrate area, it can be useful to make the secondary branch predictor 460 a relatively simple arrangement compared to a more thorough and costly primary branch predictor 130.

The performance penalty relating to an incorrect branch prediction is that potentially the fetch and decode pipelines have to be flushed in order to reload instructions at the now-correct program counter value. However, from the point of view of the executing data processing instructions, this is simply a potential performance penalty and does not affect or require any change to the instructions themselves.

A first example of the secondary branch predictor 460 would involve simply predicting all branches as "not taken". This can be achieved without even requiring specific circuitry beyond a connection between the signal line indicating the branch prediction and a fixed level 607 corresponding to the output of that signal line which would indicate "not taken". Note that in the case of FIG. 6b, a prediction of the branch target is not required. This is because the consistent prediction of "not taken" means that in the absence of an execute stage redirection 416, the next address to be fetched will always be the PC value generated by the adder 420 of FIG. 4, which is to say the next consecutive PC value. Therefore, in the example of FIG. 6b, in the secondary mode, the branch predictor is configured to generate a fixed prediction of a next data processing instruction to be fetched for execution. For example, the fixed prediction may be a prediction that a branch is not taken.

The arrangement of FIG. 6b provides a prediction which brings simplicity of implementation by being independent of any aspect or parameter of the data processing instruction. However, in further examples, of FIGS. 6c and 6d, in the secondary mode, the branch predictor is configured to generate a prediction of a next data processing instruction to be fetched for execution in response to one or more predetermined parameters of a current data processing instruction. The predetermined parameter can be, for example, the address (PC) of the instruction and/or a branch target derived from the instruction.

The example of FIG. 6c concerns a simple look-up table 600 with a predetermined list of program counter values or ranges and associated branch outcomes and/or targets 610.

In a further example of FIG. 6d, when the current data processing instruction is a branch instruction, a predetermined parameter comprises whether a branch operation defined by the branch instruction is a forward branch operation or a backward branch operation relative to a current program counter value; and in the secondary mode the branch predictor is configured to predict, as a next data processing instruction to be fetched, a data processing instruction at a target address of the branch instruction when the branch operation is a backward branch and to predict, as a next data processing instruction to be fetched, a data processing instruction at a next program counter value when the branch operation is a forward branch operation.

In FIG. 6d, for a branch instruction at a program counter value 700, the branch target is either established from the instruction itself or obtained from a simple lookup-up table 710. Then, based upon the program counter value and the target or predicted target address, a forward/backward detector 720 detects whether the PC jump represented by the potential branch instruction is forwards or backwards relative to the current PC value. A simple branch prediction algorithm can then be used such that, for example, all forward branches are predicted as not-taken and all backward branches are predicted as taken.

Example of Cache Memory Circuitry

FIG. 7 schematically illustrates an example of the cache memory circuitry 428 of FIG. 4.

Various types of cache memory circuitry may be used in the present embodiments, and just one example is provided in FIG. 7. This is an example of a so-called 4-way set associative cache memory in which a data item at a particular memory address 730 (such as a physical address) may be stored in any of a set 740 of four memory locations or "ways" in the cache memory 750 which are associated with the address 730 by a function such as a hashing function implemented by control and addressing circuitry 760. In general terms, when a new data item is to be allocated into the cache memory 750, the control and addressing circuitry 760 derives (for example using the hashing function) one of the sets 740 and selects either a currently vacant way or (if all of the ways are currently occupied) selects a way from which the current contents are evicted so that the new data item can be stored in that particular way.

In many examples, the data items are so-called cache lines, for example of 256 bits. Because, using the hashing function, multiple addresses 730 map to the same set 740 of ways, each way includes so-called tag information giving an indication of the actual address of the data stored in that way.

The control and addressing circuitry 760 is responsive to an invalidation control signal 762 to invalidate some or all of the data stored in the cache memory 750. The control and addressing circuitry 760 can also detect whether a particular required data item (to be read from the cache memory 750) is present in the cache memory 750 or not, and if not, the control and addressing circuitry 760 generates the miss signal 438.

Read/write circuitry 770 accesses the way selected by the control and addressing circuitry 760 for the purposes of writing newly allocated data or reading currently stored data from the selected way.

Applicability to Other Example Cache Memories

The example used in FIGS. 4 and 7 concerns an instruction cache in which the stored data items are data processing instructions. In such an example the cache memory is an instruction cache; and the one or more data items are data processing instructions.

However, the present techniques are equally applicable to other types of cache memory, for example a data cache memory in which the stored data items are operands or the like used in execution of data processing instructions by the data processor 110, or for example a so-called write-through cache memory used as part of a data storage strategy in which data are written into the write-through cache memory and to the corresponding main memory location substantially at the same time.

Timing Examples

Figure 9:
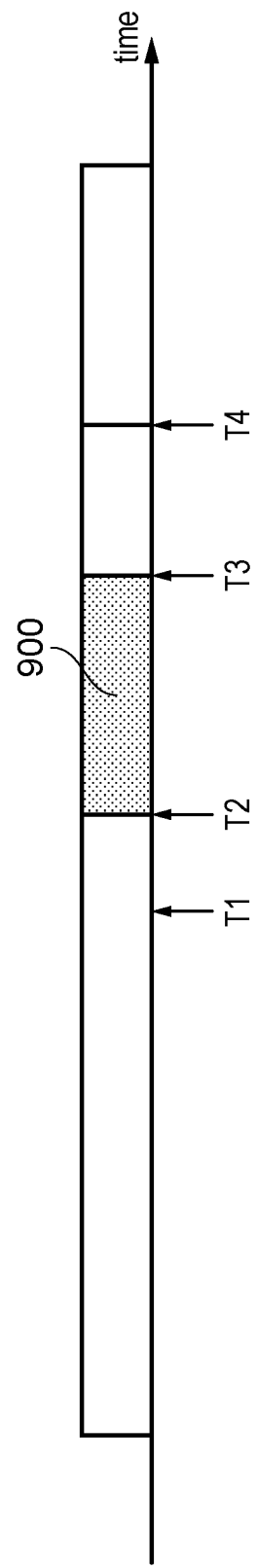
Figure 10:
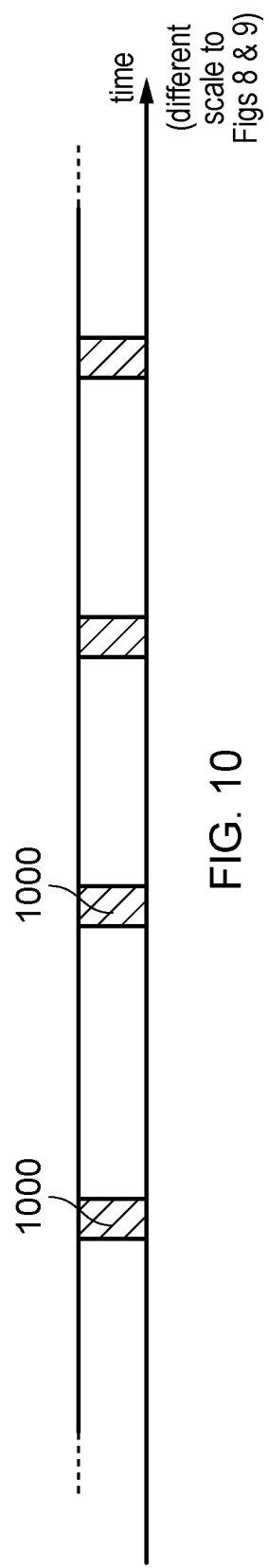

Aspects of the timing of testing operations such as those discussed above will now be described with reference to FIGS. 8-10. In each of FIGS. 8-10, time is shown on a horizontal axis is drawn, progressing towards the right-hand side of each diagram. Note that the time axis in FIG. 10 is drawn to a different scale to that of FIGS. 8 and 9.

Figure 8:
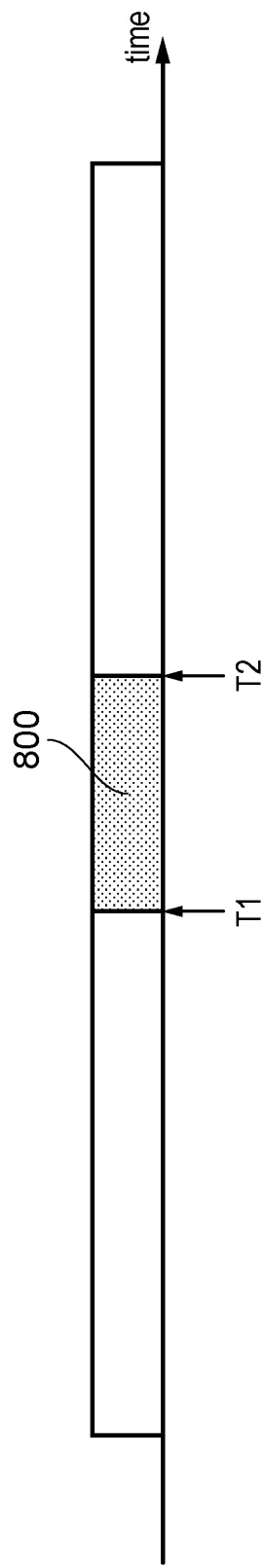
FIGS. 8-10 are schematic timing diagrams.

Referring to FIG. 8, in a simple arrangement, a testing operation is initiated by the supervisory processor 210 at a time T1, in response to which the relevant MBIST controller 440, 470 implements the step 300 of FIG. 3 straightaway. The testing process is shown by the shaded portion 800 of the timeline and finishes at a time T2, at which time the relevant MBIST controller 440, 470 implements the step 370 to return the memory under test to normal operation.

At least in the example of the branch predictor memory 134, however, such an arrangement of FIG. 8 could lead to potential conflicts of data, in that the time T1 could occur by chance when a prediction has just been made by the primary branch predictor 130, but during the period of testing represented by the shaded portion 800, the resolution of a predicted branch could be received from the execution circuitry 116 but there is no possibility at that point of being able to update the branch predictor memory 134. Similarly, a prediction made by the secondary branch predictor 460 would be resolved after the time T2 of FIG. 8 and lead to update data being provided to the primary branch predictor 130 with nothing in fact to validly update.

To alleviate this potential issue, in FIG. 9, assuming that the supervisory processor 210 initiates a particular testing operation at the time T1, the MBIST controller 470 in fact waits until a potentially later time T2 before implementing the step 300 of FIG. 3. For example, the MBIST controller 470 could wait until an execute stage redirection is implanted by the execution circuitry 116 and indicated by the signal 416. Noting that at this stage, the entire fetch and decode pipeline is flushed, any pre-existing or recently made predictions are also flushed and the chance of a conflict of the type discussed above is reduced or removed.

Assume that the testing process takes a similar length of time to that shown in FIG. 8, represented by a shaded portion 900 of the timeline, so that the testing process itself reaches the end of the stages 310 . . . 350 by a time T3. However, in the present examples, the MBIST controller 470 waits until a potentially later time T4 to implement the step 360, 370 (or at least to implement the step 370), where the time T4 represents a next occurrence of an execute stage redirection occurring after the time T3 at which the main part of the testing process completed. For the same reasons as just described, this can avoid potential conflicts upon resuming normal operation of the branch predictor memory 134.

This provides an example in which the test circuitry is configured to control the data handling circuitry to transition between the primary mode and the secondary mode in response to an operation by the fetch circuitry to discard the currently fetched instruction and to flush the one or more queues. Note that this criterion (waiting for a flushing operation) can be applied for transitions in either or both directions). Therefore, the transition between modes is "in response to" (but not necessarily immediately following) the initiation of a testing operation.

However, in other examples, the opposite arrangement may in fact be used, in that the fetch circuitry and the branch predictor may be configured to discard the currently fetched instruction and to flush the one or more queues in response to a transition between the primary mode and the secondary mode.

So, either the occurrence of a flushing operation provides a useful time to transition between modes, or the transitioning between modes can be facilitated by flushing the one or more queues at the same time.

On a different time scale, FIG. 10 schematically represents the so-called duty cycle of the testing process, in that most of the time (represented by unshaded portions of the timeline of FIG. 10) the system is in normal operation, and in only a relatively small proportion of time (represented by shaded portions 1000) the testing process is applied so that the data handling circuitry having the memory under test operates in the secondary mode.

Therefore in the example of FIG. 10, in which the test controller comprises memory built-in self-test circuitry to test a portion of the memory, the test circuitry is configured to buffer the contents of the portion of the memory, to write a set of test values to the portion of the memory and to detect whether the test values are successfully read from the portion of the memory, and to return the buffered contents to the portion of the memory; and the test controller is configured to test a respective portion of the memory at each of a set of test periods separated in time.

Corresponding Method

Figure 11:
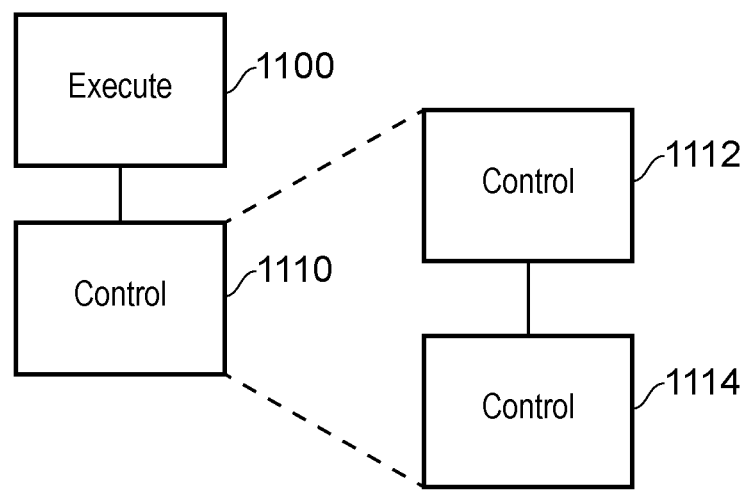
FIG. 11 is a schematic flowchart illustrating a method.

FIG. 11 is a schematic flowchart illustrating a method comprising: executing (at a step 1100) data processing instructions by reference to a data handling function performed by associated data handling circuitry having a memory, the data handling circuitry being operable in a primary mode in which the data handling circuitry performs the data handling function by accessing the memory and in a secondary mode in which the data handling circuitry performs the data handling function independently of the memory; and controlling (at a step 1110) a test operation during execution of a set of data processing instructions by the data processor.

The controlling step 1110 can comprise:

controlling (at a step 1112) the data handling circuitry to transition from the primary mode to the secondary mode in response to initiation of a test operation on the memory so that the executing step executes one or more of the set of data processing instructions by reference to the data handling function performed by the data handling circuitry in the secondary mode at least while the test operation is performed on the memory; and controlling (at a step 1114) the data handling circuitry to return to the primary mode in response to completion of the test operation on the memory.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function, in which case software or program instructions by which the function is performed, and a providing medium such as a non-transitory machine-readable medium by which such software or program instructions are provided (for example, stored) are considered to represent embodiments of the disclosure. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

The invention claimed is:

1. Circuitry comprising:

data handling circuitry having a memory, the data handling circuitry being operable in a primary mode in which the data handling circuitry performs a data handling function by accessing the memory and in a secondary mode in which the data handling circuitry performs the data handling function independently of the memory;

test circuitry to control a test operation during execution of a set of data processing instructions by a data processor configured to execute data processing instructions by reference to the data handling function performed by the data handling circuitry;

in which:

the test circuitry is configured to control the data handling circuitry to transition from the primary mode to the secondary mode in response to initiation of a test operation on the memory so that the data processor executes one or more of the set of data processing instructions by reference to the data handling function performed by the data handling circuitry in the secondary mode at least while the test operation is performed on the memory; and the test circuitry is configured to control the data handling circuitry to return to the primary mode in response to completion of the test operation on the memory.

2. The circuitry of claim 1, comprising the data processor; in which the test circuitry comprises a test controller operating under the control of the data processor.

3. The circuitry of claim 1, comprising a supervisory processor separate to the data processor;

in which the test circuitry comprises a test controller operating under the control of at least the supervisory processor.

4. The circuitry of claim 1, in which:

the data handling circuitry comprises a branch predictor; and the data handling function comprises the prediction of a next data processing instruction to be fetched for execution by the data processor.

5. The circuitry of claim 4, in which:

the memory is configured to store history information dependent upon an execution outcome of at least a subset of branch data processing instructions previously executed by the data processor; and in the primary mode, the branch predictor is configured to predict a next data processing instruction to be fetched for execution in dependence upon the stored history information in the memory.

6. The circuitry of claim 4, in which, in the secondary mode, the branch predictor is configured to generate a prediction of a next data processing instruction to be fetched for execution in response to input data selected from the list consisting of:

(i) one or more predetermined parameters of a current data processing instruction; and (ii) data stored in one or more registers indicative of the execution outcome of at least a subset of branch data processing instructions previously executed by the data processor.

7. The circuitry of claim 6, in which:

when the current data processing instruction is a branch instruction, a predetermined parameter comprises whether a branch operation defined by the branch instruction is a forward branch operation or a backward branch operation relative to a current program counter value; and the branch predictor is configured to predict, as a next data processing instruction to be fetched, a data processing instruction at a target address of the branch instruction when the branch operation is a backward branch and to predict, as a next data processing instruction to be fetched, a data processing instruction at a next program counter value when the branch operation is a forward branch operation.

8. The circuitry of claim 4, in which, in the secondary mode, the branch predictor is configured to generate a fixed prediction of a next data processing instruction to be fetched for execution.

9. The circuitry of claim 8, in which the fixed prediction is a prediction that a branch is not taken.

10. The circuitry of claim 4, comprising fetch circuitry to fetch data processing instructions for execution, the fetch circuitry and the branch predictor cooperating to maintain one or more queues of data defining one or more predicted instructions, in which the fetch circuitry is configured to discard a currently fetched instruction and to flush the one or more queues in response to a flushing event selected from the list consisting of: execution of a given branch instruction by the data processor generating a branch in program flow different to a branch flow predicted by the branch predictor, a processor interrupt and a processor context switch.

11. The circuitry of claim 10, in which the test circuitry is configured to control the data handling circuitry to transition between the primary mode and the secondary mode in response to an operation by the fetch circuitry to discard the currently fetched instruction and to flush the one or more queues.

12. The circuitry of claim 10, in which the fetch circuitry and the branch predictor are configured to discard the currently fetched instruction and to flush the one or more queues in response to a transition between the primary mode and the secondary mode.

13. The circuitry of claim 10, in which the branch predictor is configured to associate information with instructions in the one or more queues indicative of whether a prediction of those instructions was made by the branch predictor operating in the primary mode or in the secondary mode.

14. The circuitry of claim 1, in which:
the associated data handling circuitry comprises cache control circuitry;
the memory is a cache memory; and
the data handling function comprises providing one or more data items to the data processor.

15. The circuitry of claim 14, in which the test controller is configured to control the data processor not to retrieve data processing instructions from the cache memory during operation of the data handling circuitry in the secondary mode.

16. The circuitry of claim 13, comprising:
a buffer;
in which the test circuitry is configured to control the buffer to buffer operations to modify the contents of the cache memory initiated during operation of the data handling circuitry in the secondary mode, the test circuitry being configured to control the cache memory to implement the buffered operations to modify the contents of the cache memory in response to the data handling circuitry returning to the primary mode.

17. The circuitry of claim 16, in which:
the buffer has a capacity to buffer up to a predetermined number of operations to modify the contents of the cache memory; and
the test circuitry is configured, in response to more than the predetermined number of operations to modify the contents of the cache memory being initiated during operation of the data handling circuitry in the secondary mode, to control the invalidation of the cache memory in response to the data handling circuitry returning to the primary mode.

18. The circuitry of claim 12, in which:
the cache memory is an instruction cache; and
the one or more data items are data processing instructions.

19. The circuitry of claim 18, comprising:
fetch circuitry to fetch data processing instructions for execution, the fetch circuitry being configured, for a given data processing instruction having an associated parameter indicating that the given data processing instruction is cachable, to store the given data processing instruction in the instruction cache and, for a given data processing instruction having an associated parameter indicating that the given data processing instruction is non-cachable, to provide the given data processing instruction directly to the data processor for execution;
and in which the test circuitry is configured to set the associated parameter to non-cachable for the one or more data processing instructions fetched during operation of the data handling circuitry in the secondary mode.

20. A method comprising:
executing data processing instructions by reference to a data handling function performed by associated data handling circuitry having a memory, the data handling circuitry being operable in a primary mode in which the data handling circuitry performs the data handling function by accessing the memory and in a secondary mode in which the data handling circuitry performs the data handling function independently of the memory;
controlling a test operation during execution of a set of data processing instructions by the data processor;
the controlling step comprising controlling the data handling circuitry to transition from the primary mode to the secondary mode in response to initiation of a test operation on the memory so that the executing step executes one or more of the set of data processing instructions by reference to the data handling function performed by the data handling circuitry in the secondary mode at least while the test operation is performed on the memory; and
controlling the data handling circuitry to return to the primary mode in response to completion of the test operation on the memory.

* * * * *